United States Patent [19]

Anglin et al.

[11] Patent Number: 5,428,802
[45] Date of Patent: Jun. 27, 1995

[54] METHOD AND APPARATUS FOR EXECUTING CRITICAL DISK ACCESS COMMANDS

[75] Inventors: Janet S. Anglin, San Martin; Lloyd R. Shipman, Jr., San Jose, both of Calif.

[73] Assignee: International Business Machines Corporation, Armonk, N.Y.

[21] Appl. No.: 524,206

[22] Filed: May 16, 1990

[51] Int. Cl.$^6$ .............................................. G06F 13/00
[52] U.S. Cl. ..................... 395/800; 395/275; 364/926.9; 364/927.92; 364/DIG. 2
[58] Field of Search ............................. 395/275, 800; 364/926.9, 927.92, DIG. 2

[56] References Cited

U.S. PATENT DOCUMENTS

| | | | |
|---|---|---|---|
| 3,688,274 | 8/1972 | Cormier et al. | 364/200 |
| 3,771,143 | 11/1973 | Taylor | 340/172.5 |
| 3,911,402 | 10/1975 | McLean et al. | 340/172.5 |
| 3,997,876 | 12/1976 | Frush | 340/172.5 |
| 4,405,952 | 9/1983 | Slakmon | 360/49 |
| 4,471,457 | 9/1984 | Videki, II | 395/275 |
| 4,727,477 | 2/1988 | Gavril | 395/273 |
| 5,077,736 | 12/1991 | Dunphy et al. | 371/10.1 |

OTHER PUBLICATIONS

IBM Technical Disclosure Bulletin—Executing a Reserve Release on Sub Device Data Increments in a DASD System—Brock, Cortney, Farabaugh—Jan. 1977—pp. 3219-3221.
IBM Technical Disclosure Bulletin—Feature Free Multi-CPU Lock Processor—Brannon, Larson—Apr. 1978—pp. 4323-4324.
IBM Technical Disclosure Bulletin—Method for Shared Resource Locking on Names at a Resource Control Unit—Behman, DeNatale—Nov. 1978—p. 2522.
IBM Technical Disclosure Bulletin—Reserve/Release Record-Level Lock for DASD Shared By Multiple Central Processing Units—Chandra, Katcher, Smith—Nov. 1979—pp. 2571-2573.
IBM Technical Disclosure Bulletin—Dynamic Fixed File Alternate Sector Assignment and Management—Crabtree Daughenbaugh—Nov. 1980—pp. 2489-2492.
IBM Technical Disclosure Bulletin—Enhancement to the Dynamic Alternate Assignment of Disk Secotrs—Pickering, Voss, Way—Apr. 1984—pp. 6118-6119.

Primary Examiner—Alyssa H. Bowler
Assistant Examiner—John Harrity
Attorney, Agent, or Firm—G. Marlin Knight; Paik Saber

[57] ABSTRACT

The present invention is a controller and a method for its use in a disk data storage and retrieval system. The controller is of the type which associates a file mask with a sequence of commands. The controller has means for executing a critical-section-start (CSS) command received from the host computer which indicates to the controller that a critical sequence of commands will follow and places the controller in a critical sequence mode (CS mode). The controller has means for executing a critical-section-end (CSE) command which indicates the end of the commands. While in the CS mode the controller checks the file mask for each command received and refuses to execute selected commands which are not associated with predetermined values of the file mask (CS file masks). A program running on the host computer sends the controller a command establishing a CS file mask and the CSS command, then the program sends one or more sequences of critical commands to the controller. After the critical commands have completed successfully, the program sends the CSE command which returns the controller to the normal operating mode. If the critical commands fail then appropriate error recovery is performed while the controller is in the CS mode. The CS mode is used in conjunction with CS file masks to effect limitation of access to the disk system while critical commands are executing. More particularly the controller is used to perform concurrent media maintenance wherein media maintenance is performed on a suspect track while the user data formerly on that track is fully accessible by virtue of being copied to an alternate track.

5 Claims, 6 Drawing Sheets

METHOD AND APPARATUS FOR EXECUTING CRITICAL DISK ACCESS COMMANDS

TECHNICAL FIELD

The present invention relates to methods and apparatus for executing critical disk access commands in disk data storage and retrieval systems. More specifically, the invention relates to an improved method and apparatus for executing critical disk access commands in a protected mode which enforces limited access to the disk system until the critical commands have completed.

BACKGROUND OF THE INVENTION

Typical disk data storage and retrieval systems (disk systems) include a controller connected to one or more disk files. The controller may be a physically separate device or it may be integrated with the disk file in a single device. The disk files contain the actual data storage hardware. The controller provides the external interface for the disk system. The term disk system is used herein to refer to the combination of one or more disk files with a controller whether they are in separate devices or integrated in a single device. In normal usage the controller is connected to one or more computers. The invention described herein can be used where the controller is connected to multiple computers, but except where otherwise noted the following material assumes that the controller is connected to a single computer. A computer may be connected to many controllers. Typically the computer is operating under the control of a multiprogramming operating system which allows multiple programs (or tasks) to execute in an interleaved manner so that the disk system is, in effect, shared by multiple programs.

To operate the disk system a program running on the the computer sends commands to the controller for execution. The commands may reference or include data, as when a write command is sent which directs the controller to write specified data onto a disk file. The connection between the controller and the computer allows for two-way communication so that the controller can also send status information and data to the computer. The status information returned by the controller includes success or failure information for the commands. An example of a command that might fail is a read command. Typical disk systems have means for detecting errors in read and write actions, as well as, various other functions. It is also possible for the controller's resources to be committed so that it cannot execute a command from the computer. In this case the controller might send status information to the computer indicating that it is busy. Thus, even though the term 'command' is used in the ad, the controller is an intelligent device which can reject or refuse to execute the commands as circumstances dictate. A typical controller includes a microprocessor and some form of memory means into which a software program, typically called microcode, is loaded. The actions taken by the controller in response to commands usually involve the microprocessor running or executing some pad of the microcode.

The computer to which the controller is adapted to be connected typically includes a component or subsystem called a channel subsystem which interfaces to the controller. In a channel environment the commands sent to the controller may be called channel commands or channel command words. Channel commands are typically communicated to the controller in a list of connected commands which are called a channel command program or command chain. The channel commands in the channel program are said to be chained together. Chaining commands together results in substantially increased efficiency when compared with execution of individual commands. The usual channel architecture requires that the controller execute the commands in the order in which the commands are placed in the chain and that the controller stop executing the chain if a command fails. Thus, if a seek command is chained to a subsequent write command, failure of the seek command will cause the controller to stop execution of the chain and the write command will not be executed. This type of channel architecture, therefore, implements conditional command execution for all but the first command in a channel command chain. The second and following commands are executed only if all of the previous commands in the chain completed successfully. Typically a command chain has exclusive access to the disk system only while the chain is executing. A computer program seeking to access the disk system may have to send several command chains to achieve a desired result. The command chains from one program may be interleaved with chains from other programs by the computer's operating system.

Each disk file contains one or more platters or disks on which data is recorded. The data is written in concentric circles on the disks which are called tracks. The data on the tracks must be organized according to a set of rules which are typically fixed in the design of the disk system. For example, the design of the disk system may require that the data be written in fixed length records or the design may allow variable length records to be written. Fixed record length designs, often referred to as fixed block architectures (FBA), typically subdivide tracks into sectors. One known technique for writing and reading variable length records is to use the count-key-data (CKD) format. As used hereinafter, 'tracks' means tracks or sectors unless otherwise noted. The data on the tracks typically includes user data and system control data. A related collection of user data written on one or more tracks is called a data set.

In order to provide for a tool for management of the resources of the disk system in the multiprogramming environment some disk systems are designed to accept commands which establish an authorization code for the sending program to execute the command sequence which follows. This authorization code is typically a string of bits which are encoded to define which commands are being authorized. In the ad this authorization code is sometimes called the file mask. The file mask can be set in more than one way, but one way is to send an express command to set the file mask followed by the file mask value. There can also be a default or minimum file mask value that is assumed without the need to expressly set a file mask. The controller checks each command against the current file mask to determine whether to execute the command. If the file mask does not authorize the command, the controller will refuse to execute it. For example, if a write command requires file mask authorization in the particular disk system implementation and if the file mask does not authorize the write command, the command will be refused execution. In a system which uses channel command programs a file mask may be set once in each program by chaining a set file mask command to the other commands. The meaning of each value of the file mask and the possible value are determined by the protocol defined in the disk system implementation. Typically the implementation defines values of the file mask as authorizing system control, system supervision, and/or diagnostic commands. Diagnostic commands are a subset of commands which are used to diagnose and correct disk system problems.

Because defects may occur in the disk surfaces it is conventional to reserve spare or alternate space on the disks which can be used to logically replace areas with defects. In a device that uses sectors, the additional space will be alternate sectors. Variable record length devices typically use entire tracks for alternates. To distinguish them from alternate tracks, the original tracks are called primary tracks. The design of the disk system must provide a way to establish a linkage between a primary track and an alternate track so that some types of read and write commands which reference the primary track will be executed upon the alternate track. One method of achieving this linkage is to reserve a portion of each track for control information which determines whether an alternate track has been established for that track and, if so, gives the address of the alternate track. There may also be separate control data kept on the disk file which identifies the tracks deemed to be defective. The design typically allows a subset of the available commands to ignore the linkage so that, for example, read and write tests may be performed on the primary track even after the linkage has been established.

Because the use of alternate tracks may have undesirable effects, techniques have been developed for adjusting for defects in a track without using an alternate track. In one scheme control information is written on the track ahead of the defect which allows the system to ignore or skip over the defect. This control information may be called skip-displacement information. Since skip-displacements cannot correct for an unlimited number of defects, it is customary to provide alternate track capability in addition to skip-displacement capability.

Typical computer operating systems provide for logging of disk errors. By examining the error log, tracks that have potential defects can be identified. In a system which allows skip-displacement information or its equivalent to be used to adjust for defects, it is possible to perform tests on the suspect track to determine exactly where the defects are, then use skip-displacements to correct the problem. Testing the track for errors requires that data be written on the track which destroys the user data that may be on the track. Therefore, prior to testing the suspect track, the user data must be copied to a backup track. If the testing and writing of skip-displacement information successfully adjusts for all of the defects on the track, then the user data can be copied from the backup track back to the original track. If the defects cannot be corrected then the system must use its alternate track technique to replace the bad track. The process of testing the track for defects and writing skip-displacement information to correct for defects is known as media maintenance. Since the proper testing of the suspect track requires that a very large number of read and writes be performed, media maintenance may require several minutes for one track. Existing methods of performing media maintenance copy the user data on the suspect track to a special track on the disk while the suspect track is being tested. This special track is reserved for use by system programs and is not accessible by general user programs. This causes the user data on the suspect track to be unavailable for general use during the entire time that tests are being performed on the suspect track.

The operation of a disk system in a typical multiprogramming environment frequently involves the execution of a sequence of disk access commands which are critical in nature. A critical sequence is one which cannot be safely interleaved with unrestricted disk access commands that are unrelated. The media maintenance process is one example of a process which involves the execution of a critical sequence of commands. When a program must execute a critical sequence of commands, actions must be taken to limit access by other programs to the disk data that is being modified until the critical commands have completed successfully. In the case where a controller is connected to multiple computers a special command is used which causes the controller to reserve the designated disk file for the exclusive use of the requesting computer. This prevents other computers which are sharing the disk file from accessing the disk file until the release command is issued, but does not limit access by other programs running on the same computer. In order to limit disk access by other programs on the same computer additional access limitation schemes must be used. Software locks and enqueueing are well known in the ad for this purpose, but have the inherent weakness that programs may bypass them and defeat the limitation. A new software protection scheme can not be used reliably where there is a requirement that previously existing application programs be allowed to run without modification.

Typically the media maintenance program (MMP) is only one of many programs executing concurrently on the computer. The MMP must take into account that other programs may try to access the disk file containing the suspect track so that disk access commands sent by the MMP may be interleaved with disk access commands from other programs. In the prior ad the MMP is required to use whatever software tools are provided by the operating system to limit access to the data on the disk file for the entire time that the media maintenance process is executing. This is true because the process involves various critical command sequences which can potentially leave the data on the suspect track or the alternate track in a corrupted or unusable state if one of more of the commands in the critical sequence fails to execute properly. For example, writing the alternate track linkage information on the suspect track is a critical step, since failure to write the correct information could cause the original data on the track to become inaccessible without correctly setting the alternate track address. If this step failed and another program attempted to read the suspect track immediately thereafter, the data read could be incorrect or the read command might fail. In a typical MMP in the prior ad, the MMP attempts to limit access during the media maintenance process by reserving the disk file for the exclusive use of the computer on which the MMP is running, allowing no new data set allocations and no access to the data set using the suspect track. Since the MMP can only use the tools provided by the operating system and the disk systems, the MMP has no way of guaranteeing that these limitations will be enforced. The fact that there are significant limitations on the use of the disk file during media maintenance and that media maintenance requires a relatively long time to perform are significant impediments to performing media maintenance using the prior ad.

There are many other disk system processes which also contain critical command sequences. For example, when new models of disk systems are produced it is often desirable to provide an additional mode of operation that is compatible with an older disk system so that a user will have the option of using the new disk system in the same way as the older system. The new disk system is said to emulate the older system. Making the switch into or out of the emulation mode of operation typically requires the execution of a critical sequence of commands which alter the control data on the tracks on a disk file. If this sequence fails all or part of the tracks on the disk file may be unusable by a concurrently executing program which tries to send commands to access that disk file immediately thereafter. Another example of a disk system process that involves critical command sequences is the reformatting of tracks. Track formats fix the total number of bytes which can be written on the track. Changing from a format which allows a certain number of bytes maximum to one which allows a different number of bytes will typically involve critical command sequences.

The prior art of disk system design and operation does not provide any completely satisfactory way to protect the disk system from access during critical command sequences, such those found in a media maintenance program.

SUMMARY OF THE INVENTION

The present invention is a controller and a method for its use in a disk data storage and retrieval system. The controller is of the type which executes one or more commands sent from a host computer which establish or associate a file mask with a sequence of commands. The controller has a memory device or means in which it stores data to record the fact that a critical command sequence has started. This data can be called a flag and must have at least two possible values or states. The first state or ON state of the flag represents that a critical command sequence is in progress and the second state or OFF state represents that a critical command sequence is not in progress. The controller has means for executing a critical-section-start (CSS) command received from the host computer which directs the controller to place the flag in the ON state indicating that a critical command sequence is starling. The controller has means for executing a critical-section-end (CSE) command received from the host computer which directs the controller to place the flag in the OFF state indicating that the critical command sequence has ended.

The state of the flag determines the operating mode of the controller. Thus, the controller has at least two operating modes: a critical sequence mode (CS mode) which is in effect while the flag is ON and a normal mode which is in effect while the flag is OFF. The CSS command places the controller in the CS mode and the CSE command places the controller in the normal mode.

While the flag is ON the controller checks the file mask for each command received and refuses to execute selected commands which are not associated with predetermined values of the file mask. The predetermined file mask values can be described as file masks authorized to execute critical command sequences (CS file masks). The set of CS file masks should be distinct from the file masks values used by normal application programs which run on the host computer. A program using a CS file mask is a CS program. Programs using file masks that are not CS file masks are non-CS programs. It is not required that all commands from non-CS programs be rejected while in CS mode, but the selected commands which must not be executed unless associated with the correct file mask include read and write commands.

The method of use for this controller is illustrated in FIG. 2. A program running on the host computer sends the controller a command establishing a CS file mask 1 and the CSS command 2. These two steps can be performed in any order. Once these two steps have been completed the program sends one or more sequences of critical commands to the controller 3. After the critical commands have completed successfully, the program sends the CSE command 6 which returns the controller to the normal operating mode. If the critical commands fail 4 then appropriate error recovery is performed 5 while the controller is in the CS mode.

More particularly the controller is used to perform concurrent media maintenance wherein media maintenance is performed on a suspect track while the user data formerly on that track is fully accessible by virtue of being copied to an alternate track which is linked to the suspect track.

The present invention solves the problem of protecting a critical command sequence by creating the special CS mode of operation in the controller and allowing a host program to command the controller to enter the CS mode when critical commands must be executed. The CS mode is used in conjunction with CS file masks to effect limitation of access to the disk system while critical commands are executing. The other programs which might be running on the one or more host computers attached to the controller do not need to be modified for this invention to be used.

For a more complete understanding of the nature and advantages of the of the present invention, reference should be made to the following detailed description taken in conjunction with the accompanying drawings.

DESCRIPTION OF THE PREFERRED EMBODIMENT

Figure 1:
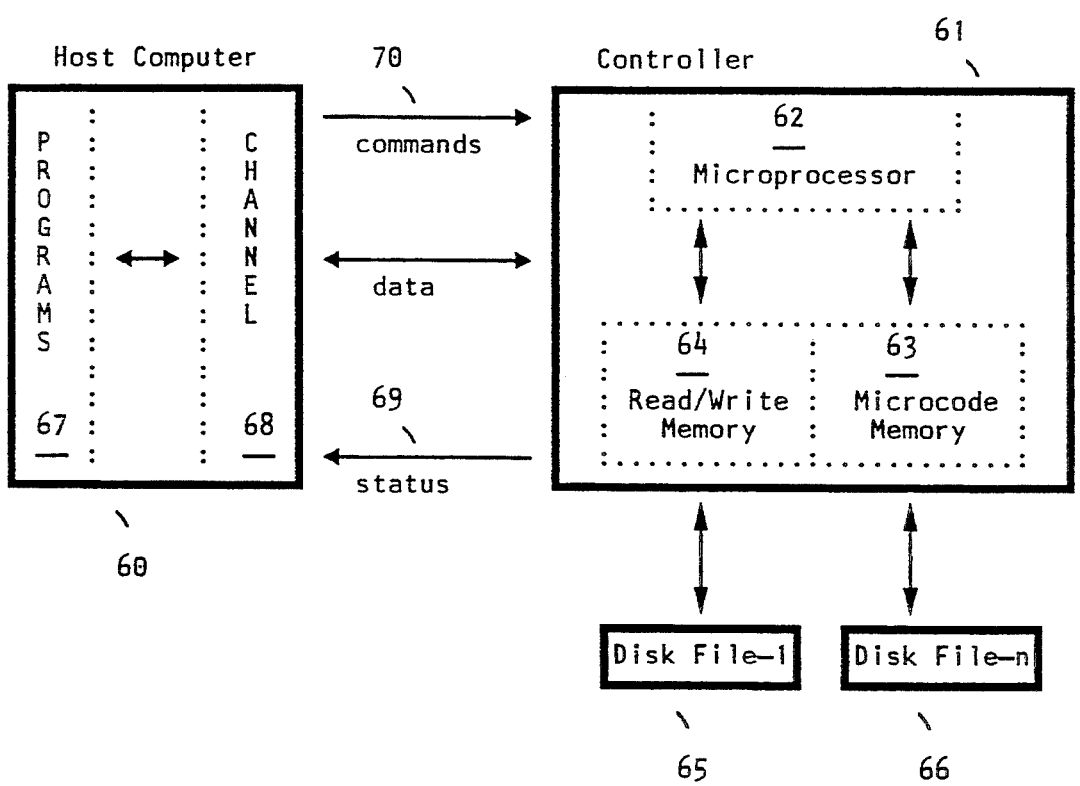
FIG. 1 is a block diagram of the controller in its operating environment.
Figure 2:
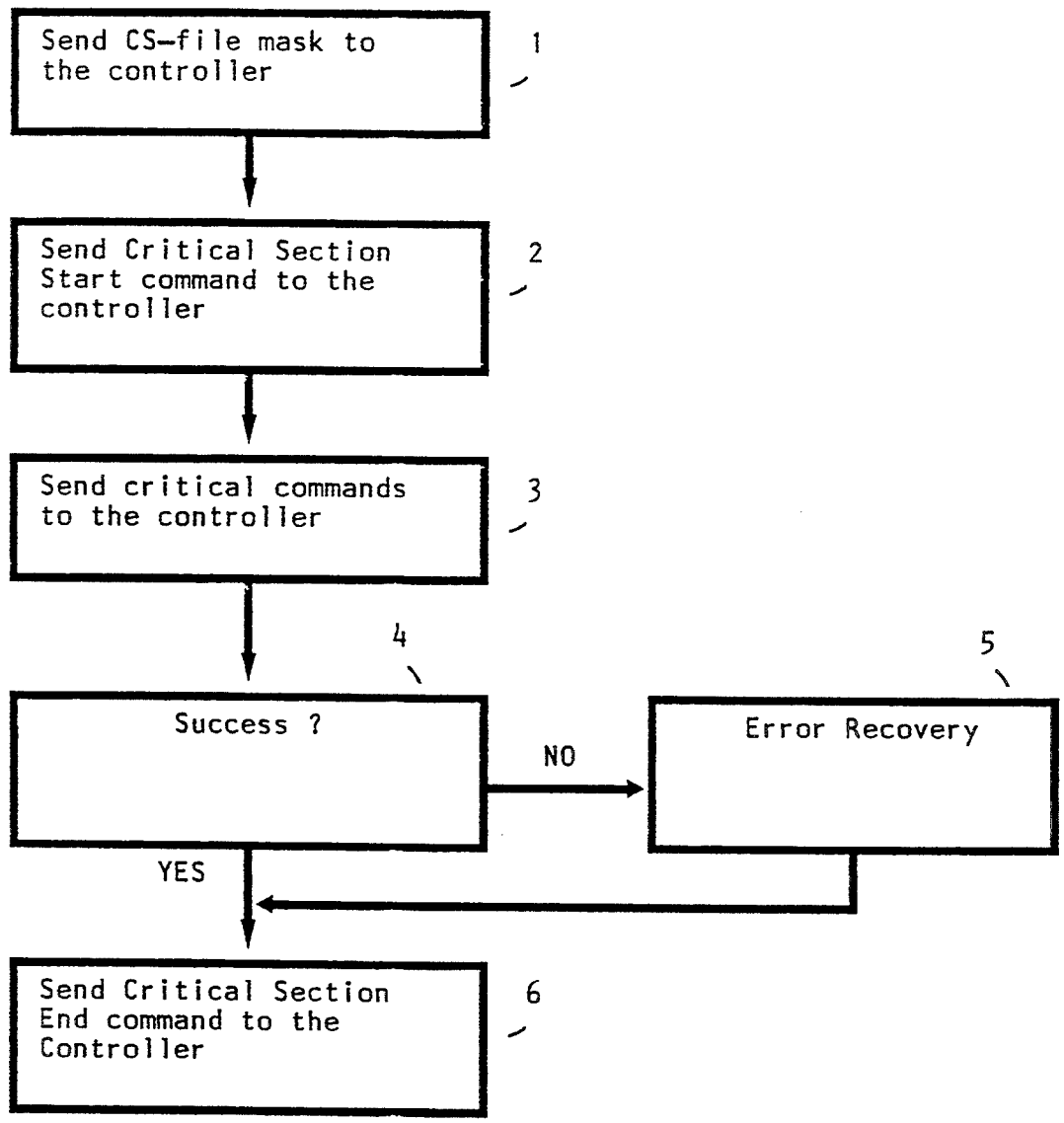
FIG. 2 is a flow chart of the process of executing a critical sequence of commands using the controller.

As shown in FIG. 1 in the preferred embodiment the controller 61 is designed to be attached to a host computer 60 with a channel subsystem 68 which supports chaining of commands in a channel program 70. The controller 61 has at least one microprocessor 62 operably connected to a memory device 63 into which microcode is loaded. The execution of the CSS and CSE commands is implemented in instructions contained in the microcode. The CSS and CSE commands reference a single disk file connected to the controller, and, therefore, the controller maintains a critical section flag for each disk file 65,66 attached to it. It is possible for the CS mode to apply to all disk files attached to the controller, but it is preferred to have the controller associate the CS mode with a designated disk file. Since the controller keeps flags for each disk file attached to it, the operating mode of the controller in regard to one disk file is independent of the operating mode for the other disk files. Thus, one or more disk files can be associated with the CS mode while the remainder are operated in the normal mode. The flags which are used to determine whether the controller is in CS mode are stored in a read/write memory 64. The initial state of the flags when the controller is prepared for standard operation is the OFF state.

Figure 6:
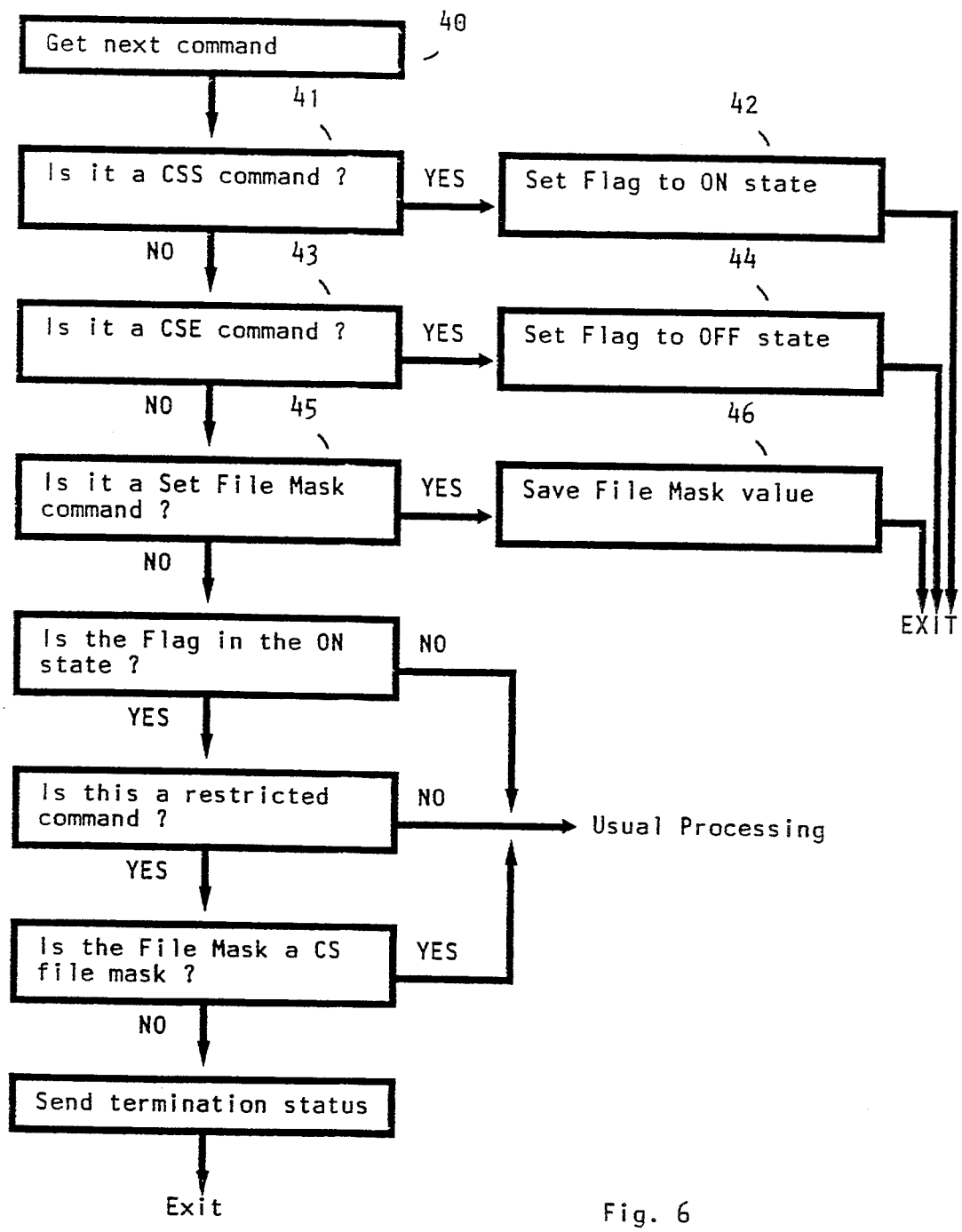
FIG. 6 is a flow chart of the internal operation of the controller.

The file mask value is set by a command contained in the channel program 70 or as a parameter (FIG. 4, block 21) passed with channel program at the time the channel program is presented to the controller. The file mask value is saved in the read/write memory 64 of the controller (FIG. 6, block 46) for later reference. Once set the file mask is associated with all of the following commands in the channel program.

The controller's actions while in the CS mode are controlled by the microcode. After the CSS command has been executed the controller will check each command for proper CS file mask authorization and reject those commands, such as the read and write commands, which should only be executed by a CS program while the CS mode is in effect. The controller rejects the commands by using the standard channel status information returned to the computer (FIG. 1, 69). The critical sequence of commands can be placed in a channel program which includes the command to set the CS file mask, the CSS command, the critical commands, and the CSE command in the correct order to allow the controller to return to the normal mode automatically if the critical commands all complete successfully.

The preferred method of using the controller is to perform concurrent media maintenance (CMM) on a track on a disk file, and particularly to establish and disestablish linkage between a primary track and an alternate track while in CS mode. CMM is the process of performing media maintenance on a track while allowing concurrent access to all of the user data on a disk file. The disk file uses the count-key-data (CKD) format for recording variable length records, uses a record (record 0) on each track to record information which determines whether an alternate track has been established and the address of the alternate track, if any, and keeps a readable and writable field of control information which determines whether the track is defective. To implement CMM on a computer attached to the controller programs 67 for execution on the computer are written or existing programs are modified. The host computer media maintenance program (MMP) should be the only program executing on the host computer using CS file masks. The MMP is stored in one or more memory devices in machine readable form which allows the computer to load and execute the program. Any reasonably long term memory device such as a disk file, diskette, tape, ROM, or EPROM is suitable.

Figure 3:
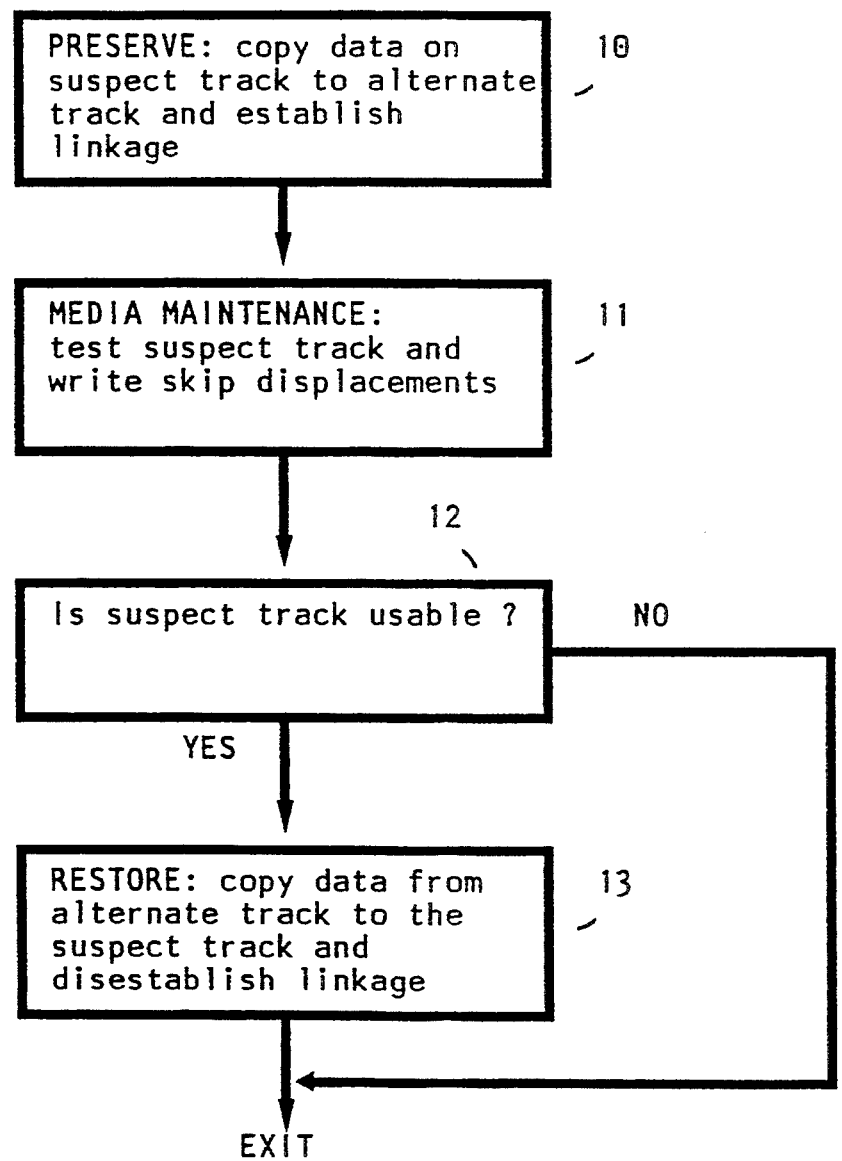
FIG. 3 is a flow chart of the overview of the process of performing concurrent media maintenance.

FIG. 3 is an overview of the CMM process. The first step is called the PRESERVE step 10. The MMP first preserves the user data on the suspect track by copying it to an alternate track.

Figure 4:
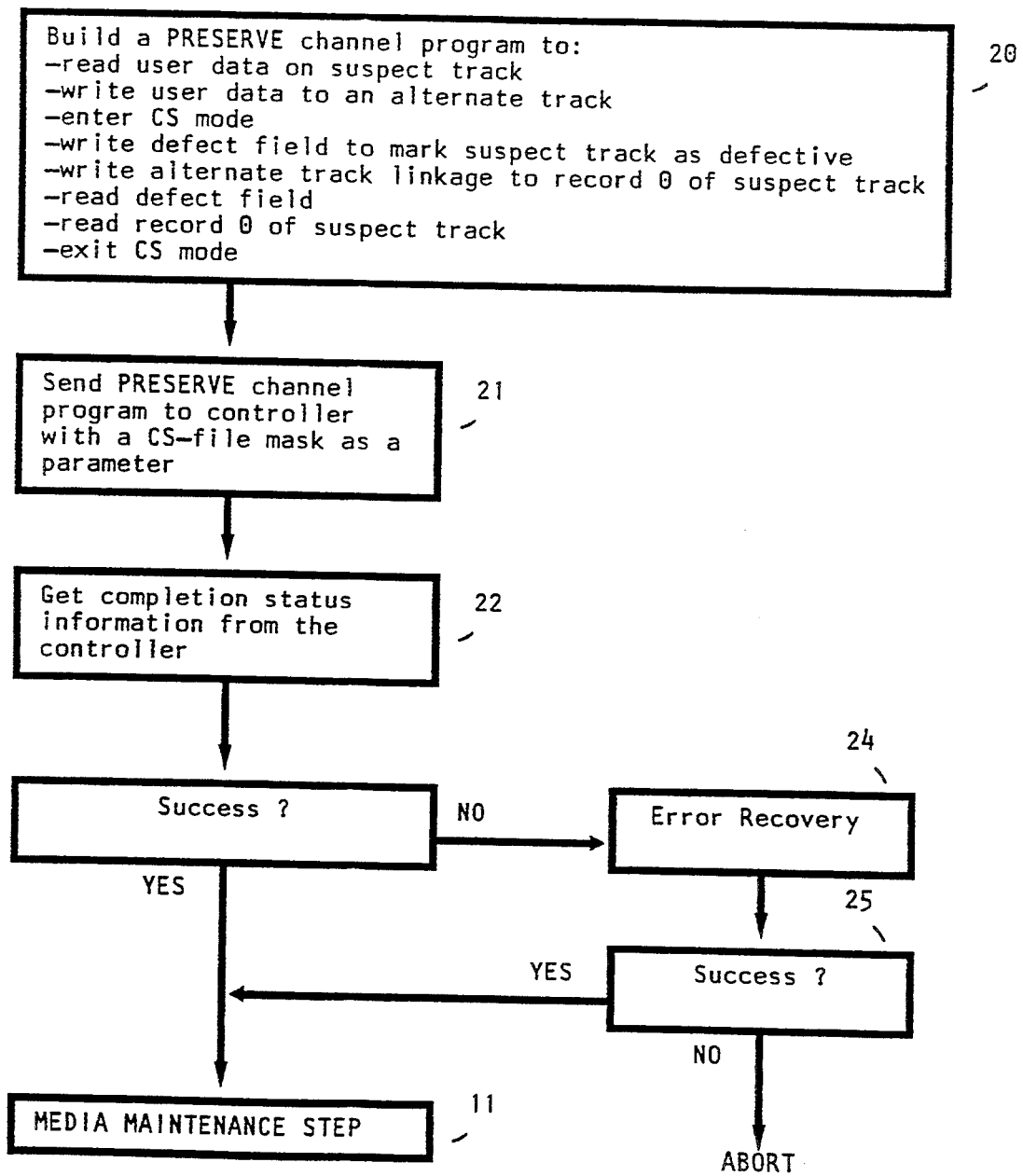
FIG. 4 is a flow chart of the PRESERVE step of concurrent media maintenance.

The preferred method of performing the PRESERVE step is shown in FIG. 4. First a single channel program 20 is created which copies the user data from the suspect to the alternate track, executes the CSS command, writes the defect field information to mark the suspect track as defective, writes record 0 on the suspect to point to the alternate track, reads the defect field information, reads record 0, then executes the CSE command. Reading the defect field information and record 0 after writing it is a way of verifying that these two steps were in fact successfully completed, but either or both of these commands can be omitted. The PRESERVE channel program is sent 21 to the controller along with the CS file mask as a parameter and the completion status is retrieved 22 from the controller. If the channel program executes completely and successfully then the suspect track will be delinked from the normal operation of the system because of the alternate track linkage. If any command executed during the process of copying the data to the alternate track fails, the controller will stop executing the chain, so that the critical command sequence will not be started and the controller will be left in the normal operating mode allowing all programs to continue to execute normally. If a command fails after the CSS command has executed, the controller will be left in the CS mode which will cause the controller to begin rejecting all data access commands for the designated disk file except for those with CS-authorization which in the preferred case will mean that only the MMP has access to the disk file. With exclusive access to the disk file, the MMP can safely perform error recovery 24. If the error recovery is successful 25 then the media maintenance step can be executed; otherwise the process can be aborted.

After the PRESERVE step has been successfully completed the MMP can perform media maintenance 11 on the suspect track without limiting access to any of the user data on the disk file. Thus, the MMP performs concurrent media maintenance (CMM) by allowing normal access to the user data on the disk file while the suspect track is being tested and skip-displacement information is written as required. While the testing is in progress one or more concurrently executing programs may read from and/or write data to the alternate track and may allocate new data sets on the disk file. Since no command is issued to reserve the disk file for the exclusive use of the computer on which the MMP is running, programs running on other computers which are attached to the controller may also access the disk file in an unrestricted manner.

When the media maintenance step has been completed the MMP will either determine that the suspect track is unusable or it will restore the suspect track to normal functioning. If the suspect track is unusable, then the MMP will leave the alternate track linkage in place. If the suspect track is usable (FIG. 3,12), in the RESTORE step 13 the current data on the alternate track is copied to the suspect track and the alternate track linkage is disestablished.

Figure 5:
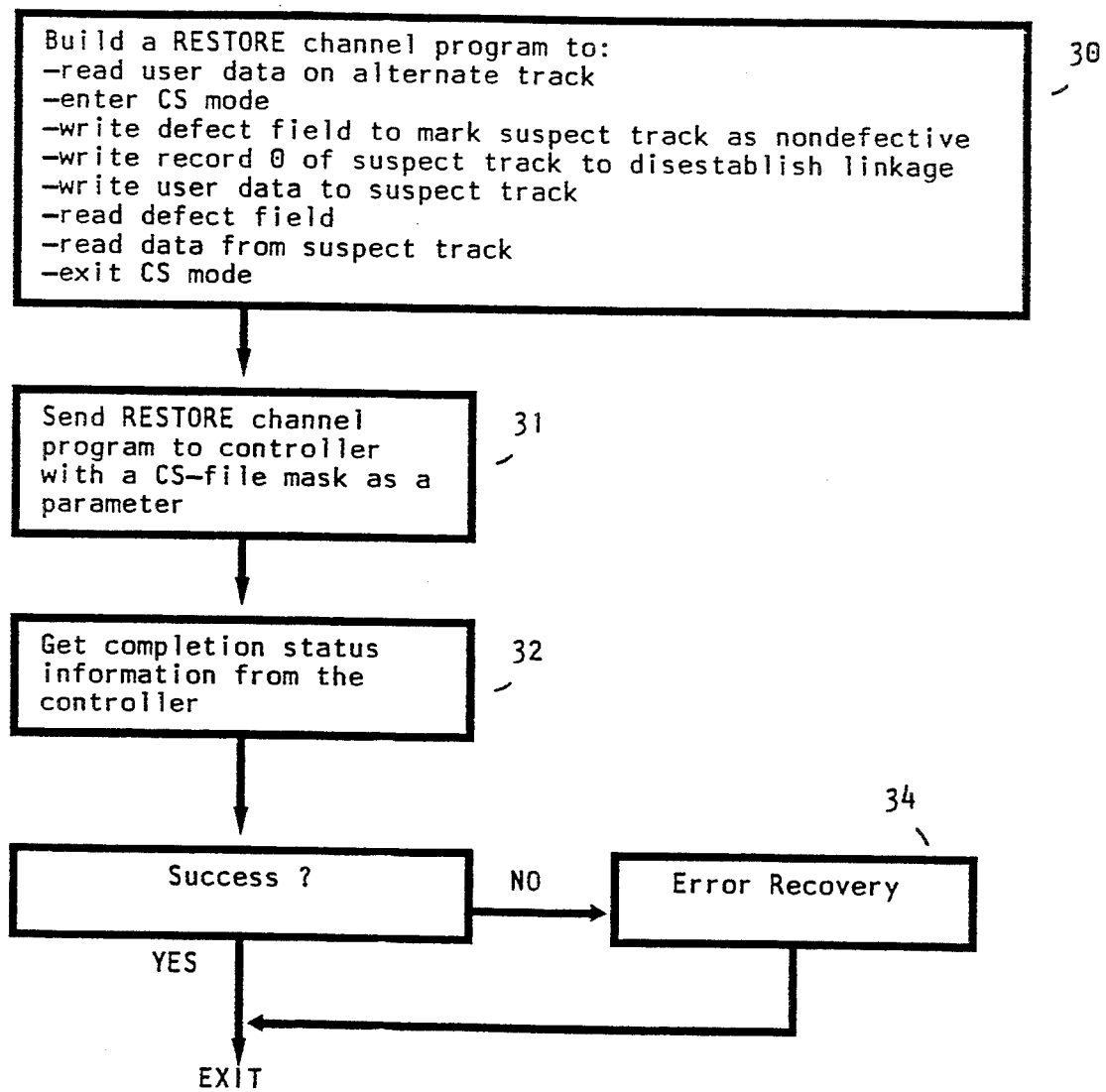
FIG. 5 is a flow chart of the RESTORE step of concurrent media maintenance.

The preferred method of performing the RESTORE step is shown in FIG. 5. A single RESTORE channel program 30 is to created which reads the user data from the alternate track, executes the CSS command, writes the defect field information to mark the suspect track as nondefective, writes record 0 on the suspect track to remove the alternate track linkage, writes the user data to the suspect track, reads the defect field, reads the data from the suspect track, then executes the CSE command. The last two read sequences are present for verification purposes, but either or both of these commands can be omitted. The RESTORE channel program is sent to the controller with a CS file mask as a parameter 31. After the controller executes the program the status is obtained 32. If the channel program executes completely then the suspect track will have been restored to normal operation. If the restore channel program fails before the CSS command is executed, the controller will be left in the normal operating mode allowing all programs to continue to execute using the alternate track. If a command fails after the CSS command has executed, the controller will be left in the CS mode which will cause the controller to begin rejecting all data access commands for the designated disk file except for those with CS-authorization which in the preferred case will mean that only the MMP has access to the disk file. With exclusive access to the disk file, the MMP can safely perform error recovery 34 and return the disk file to a usable state.

The controller and the method of using it have the advantage that they allow a new disk system to be developed which can be used in an existing computer system for which many application program already exist without the requirement of modifying the application programs. The preferred embodiment of the controller and the method of performing concurrent media maintenance (CMM) can be used in an existing computer system to obtain the benefits of CMM without requiring that application programs be modified. The use of the controller and the method of the present invention solve the problem of having to limit disk file access while media maintenance is being performed.

One skilled in the ad will note that CMM can be implemented in other ways by creating new types of commands which are executed by the controller. For example, a controller which has a single command which performs the entire PRESERVE process and another command which performs the RESTORE process can be used to implement CMM without the need for an explicit CS mode of operation.

In a similar manner to that described for media maintenance, the controller and method of the present invention can be used to switch into or out of emulation mode by executing the critical sequences of commands while in the CS mode.

One skilled in the art will easily recognize other disk file related actions may be improved through the use of the present invention. While the preferred embodiment of the present invention has been illustrated in detail, it should be apparent that modifications and adaptations to that embodiment may occur to one skilled in the art without departing from the scope of the present invention as set forth in the following claims.

What is claimed is:

1. A controller for use in a disk data storage and retrieval system, and adapted to receive a channel program comprising commands sent by a computer for execution, including critical sequences of commands, the commands including a command to associate the channel program with a file mask value, the controller having the capacity to refuse to execute the commands, the controller comprising:
 (a) memory means for storing a flag representative of a sequence of critical commands, the flag having first and second states;
 (b) means for executing a command to place the flag in the first state, indicative of the start of the sequence of critical commands;
 (c) means for executing a command to place the flag in the second state, indicative of the end of the sequence of critical commands;
 (d) means responsive to the state of the flag and to the value of the file mask for refusing to execute predetermined commands not associated with selected file mask values when the flag is in the first state whereby the controller is capable of executing the sequence of critical commands associated with a selected file mask value while the flag is in the first state and will refuse to execute predetermined commands not associated with selected file mask values until the command to place the flag in the second state is executed;
 (e) means for receiving a chained command program comprising multiple commands connected to form a chain of commands;
 (f) means for sequentially executing the chain of commands and preserving success and failure status for each command; and
 (g) means responsive to the failure status for each command for aborting the sequential execution of the commands;
 whereby the computer can position the command to place the flag in the second state after the sequence of critical commands in the chain, thereby ensuring that the controller will execute the command to place the flag in the second state only if the sequence of critical commands has completed successfully.

2. The controller of claim 1 including a microprocessor, a memory means coupled to the microprocessor for storing a microcode program, and a microcode program stored in the memory means, wherein the means for executing the command to place the flag in the first state further comprises the microprocessor executing the microcode program.

3. The controller of claim 2 wherein the means for executing the command to place the flag in the second state further comprises the microprocessor executing the microcode program.

4. The controller of claim 3 wherein the means for aborting the sequential execution of the commands further comprises the microprocessor executing the microcode program.

5. A method of operating a controller for use in a disk data storage and retrieval system, the controller being operably connected to at least one disk file and being adapted to receive a channel program comprising commands sent by a computer for execution, including sequences of critical commands, the commands including a command to associate the channel program with a file mask value, the controller having the capacity to refuse to execute the commands and having memory for storing at least one designated flag having first and second states, the method comprising the steps of:
 (a) executing a command to place the designated flag in the first state, indicative of the start of a sequence of critical commands;
 (b) refusing to execute predetermined commands not associated with selected file mask values while the designated flag is in the first state;
 (c) executing a sequence of critical commands associated with selected file mask values while the designated flag is in the first state;

(d) executing a command to place the designated flag in the second state, indicative of the end of the sequence of critical commands;

(e) receiving the command to place the designated flag in the first state, the sequence of critical commands, and lastly the command to place the designated flag in the second state as a chain of commands;

(f) sequentially executing the chain of commands and preserving success and failure status for each command; and (g) responding to a failure status for any command by aborting the sequential execution of the commands;

thereby leaving the designated flag in the first state if any command in the sequence of critical commands completes with a failure status so that step (b) will be executed if the predetermined commands not associated with selected file mask values are received.

* * * * *

UNITED STATES PATENT AND TRADEMARK OFFICE
CERTIFICATE OF CORRECTION

PATENT NO. : 5,428,802

DATED : June 27, 1995

INVENTOR(S) : Anglin et al.

It is certified that error appears in the above-indentified patent and that said Letters Patent is hereby corrected as shown below:

Column 5, line 3, delete, "ad", insert--art--.
Column 9, line 35, delete, "ad", insert--art--.

Signed and Sealed this

Twenty-eighth Day of November 1995

Attest:

BRUCE LEHMAN

Attesting Officer          Commissioner of Patents and Trademarks